United States Patent [19]
Rapeli

[11] Patent Number: 5,949,267
[45] Date of Patent: Sep. 7, 1999

[54] CIRCUIT ARRANGEMENT FOR GENERATING SIGNALS WITH DIFFERENT PHASES

[75] Inventor: Juha Rapeli, Oulu, Finland

[73] Assignee: Nokia Mobile Phones Limited, Espoo, Finland

[21] Appl. No.: 08/946,370

[22] Filed: Oct. 7, 1997

[30] Foreign Application Priority Data

Oct. 9, 1996 [FI] Finland ................................ 964041

[51] Int. Cl.[6] .................................................. H03K 3/00
[52] U.S. Cl. ......................... 327/238; 327/254; 327/255
[58] Field of Search ................................ 327/231, 238, 327/243, 244, 245, 246, 247, 254, 258, 230, 255

[56] References Cited

U.S. PATENT DOCUMENTS

| | | | |
|---|---|---|---|
| 3,675,137 | 7/1972 | Raphael | 328/144 |
| 4,453,130 | 6/1984 | Bennett | 330/51 |
| 5,285,120 | 2/1994 | Landt | 307/513 |
| 5,491,832 | 2/1996 | Malkamaki et al. | 455/33.1 |
| 5,644,260 | 7/1997 | DaSilva et al. | 327/238 |

FOREIGN PATENT DOCUMENTS

| | | |
|---|---|---|
| 0 158 197 A3 | 10/1985 | European Pat. Off. . |
| 0 345 881 A3 | 12/1989 | European Pat. Off. . |
| 0 503 416 A1 | 9/1992 | European Pat. Off. . |
| 2 242 325 | 9/1991 | United Kingdom . |

OTHER PUBLICATIONS

"Televiestintajarjestelmat (Telecommunication Systems)", 1992, Seppo J. Halme, pp. 147–244.

*Primary Examiner*—Kenneth B. Wells
*Assistant Examiner*—Hai L. Nguyen
*Attorney, Agent, or Firm*—Perman & Green, LLP

[57] ABSTRACT

The invention relates to a circuit arrangement for generating two signals having a phase difference of approximately 90 degrees. The invention is preferably applied in the demodulator of a radio receiver. In order to shift the phase of a signal one idea of the invention is to use a distributed resistance/capacitance circuit or a distributed RC circuit ($Z_{10}$, $Z_{20}$) in connection with a signal amplifying means ($A_1$, $A_2$). The operation of the circuit is not frequency dependent and a circuit adjustment is not necessarily required in order to calibrate the phase difference, because the distributed RC circuit can provide an substantially constant phase shift of ±45 degrees over a wide frequency range. The whole circuit can be integrated into one component, because a distributed RC circuit is easily made on the same integrated circuit substrate as the amplifying means, and thus the circuits can be made into a small size and at low manufacturing costs.

9 Claims, 4 Drawing Sheets

CIRCUIT ARRANGEMENT FOR GENERATING SIGNALS WITH DIFFERENT PHASES

BACKGROUND OF THE INVENTION

The invention relates to a circuit arrangement for generating two signals having a phase difference of approximately 90 degrees. The invention is preferably applied in the modulator of a radio transmitter and/or in the demodulator of a radio receiver to generate the in-phase signal (I) and the quadrature signal (Q).

In radio receivers it is common to use a so called I-Q demodulator, where either the intermediate frequency signal or the local oscillator signal is divided into two signals having a phase difference of 90 degrees. The modulation methods are generally described i.a. in the following publications: [1] Seppo J. Halme, Televiestintäjärjestelmät (Telecommunication Systems), 1992, Otatieto Oy, Espoo; and [2] Edward A. Lee, David G. Messershmitt, Digital Communication, 1990, Kluwer Academic Publishers, Boston.

In order to generate signals with different phases it is previously known to use i.a. passive RC circuits (FIG. 1) and divider circuits (FIG. 2) comprising discrete resistances and capacitances. The solution illustrated in FIG. 1 has RC circuits in two signal branches, whereby the first RC circuit R1-C1 creates a negative phase difference and the second RC circuit R2-C2 creates a positive phase difference regarding the input signal, so that with a suitable component design provides the desired phase difference between the output signals of the two signal branches. The above-mentioned RC circuits are used for substantially sinusoidal signals, because the desired phase difference is obtained only on a very narrow frequency range.

The solution embodied with RC circuits has a disadvantage in that it requires very accurate component values and small variations between individual components, and these characteristics are very difficult to obtain, particularly regarding resistors and capacitors in integrated circuits. If the required very low tolerances are not met, then the phase difference is not 90 degrees with a sufficient precision and the output signal amplitudes have a too large difference. An alternative is to use adjustable components, but an adjustment operation like this for each device causes substantial extra costs in the production of the devices. The solution realized with an RC circuit also has a disadvantage in that the phase difference and the output amplitude depend on the operating frequency and on the load.

In order to reduce the problems with RC circuits it is known to use a circuit arrangement, in which the capacitance C of the RC circuit is formed, at least partly, by a capacitance diode, and in which the phase difference is adjusted by controlling the voltage of the capacitance diode and thus its capacitance, e.g. with the aid of a processor and a D/A converter. The advantage of this solution is that the phase can be controlled automatically, but a disadvantage is the extra cost introduced by the controllable components. Further it is not easy to realize the entire circuit as an integrated circuit on semiconductor, such as silicon.

The solution shown in FIG. 2 for generating signals with different phases comprises a threshold means S and two bistable dividers F1 and F2. The output of the first divider circuit F1 changes its state at the rising edge of the input signal and the output of the second divider circuit F2 changes its state at the falling edge of the input signal, which creates a phase difference of 90 degrees between the output signals. The solution realized with divider circuits can be used only in connection with digital signals. The solution has also a disadvantage in that the signal frequency is halved, which requires the use of an input signal with double frequency. When high frequency signals are used it may be inconvenient to generate the double frequency i.a. due to the restricted operating frequencies of the components. If the circuit shall create an accurate phase difference it further requires that the pulse ratio of the input signal is exactly 50%.

Further it is known to generate a phase difference of 90 degrees using frequency multiplier, inverter and divider circuits. Then the frequency of the input signal is multiplied by two, the resulting signal is divided by two in the first signal branch (I), and correspondingly, in the second signal branch (Q) it is inverted and the frequency of the inverted signal is divided by two. The signals thus obtained have a phase difference of 90 degrees, if the performed operations were ideal. However, in practice there occurs phase delays in the signal path, so that it is very difficult to obtain a sufficiently accurate phase difference. Further the frequency multiplier and divider circuits consume a substantial amount of supply energy, which will shorten the operating time in battery and accumulator powered equipment.

The I/Q-demodulator solutions currently used for instance in digital radiotelephones require the use of a manually adjustable trimmer resistor or trimmer capacitor to control the phasing of the I/Q injection signals controlling the demodulator, because the components in the circuit have values varying within certain tolerances from one individual to the other. The trimmers cause extra costs in the production, further their adjustment is inconvenient, and mechanically adjustable components are also more unreliable when compared to fixed components.

SUMMARY OF THE INVENTION

The object of the present invention is to provide a circuit arrangement for generating signals with different phases, in which the above stated disadvantages are solved.

An idea of the invention is that a distributed resistance/capacitance circuit or a distributed RC circuit together with a signal amplifying, component is used to shift the phase of a signal. Because a distributed RC circuit can provide an substantially constant phase shift on a wide frequency range its function is not frequency dependent, and it does not necessarily require an adjustment in order to obtain the desired phase shift. Because a distributed RC circuit can easily be made on the same integrated circuit substrate as the amplifying means, the whole arrangement can be integrated in one component, and thus the circuits can be made in a small volume and at low manufacturing costs.

Here a distributed RC circuit means a circuit in which the resistance and capacitance are substantially distributed, and which has an equivalent circuit substantially according to FIG. 3. The equivalent circuit comprises an infinite number of resistors R31, R32, R33, R34, ... connected in series, and capacitors C31, C32, C33, ... connected to the junctions between the resistors and whose other terminals are interconnected. Then the distributed RC circuit is formed between the first terminal A of the first resistor and the common terminal point B of the capacitors.

FIG. 4 shows schematically one solution for the embodiment of a distributed RC circuit. There a film-like resistor 42 is made on a dielectric film 41, whereby the resistor has contact points 42a and 42b. The resistance film is located on a conducting base material 43, e.g. a metal film forming a constant potential level. The capacitance created by the dielectric film is distributed in the x direction over the whole length of the resistance film. For an alternating electric field the structure according to FIG. 4 is thus not a resistance nor a capacitance, but a so called distributed RC circuit.

In a known way it can be shown that in a distributed RC circuit the impedance between one end of the resistance film and the constant potential level is, with a very high accuracy:

$$Z = \frac{R}{\sqrt{sRC}} \quad (1)$$

when the frequency is substantially higher than $1/(2\pi RC)$. Then the phase angle generated by it is substantially 45 degrees, irrespective of the operating frequency, as for instance the phase shift of an RC circuit formed by a discrete resistance and capacitance is 45 degrees at one frequency only. In practice a distributed RC circuit can be formed for instance by a resistance film having a relatively high capacitance.

The circuit arrangement according to the invention for generating two signals from substantially the same input signal, whereby the circuit arrangement contains a first phase shift circuit comprising a first active means and a second phase shift circuit comprising a second active means, the phase shift circuits having a common input, and whereby the first phase difference between the output signal of the first phase shift circuit and said input signal is substantially −45 degrees, and whereby the second phase difference between the output signal of the second phase shift circuit and said input signal is substantially +45 degrees, is characterized in that said first phase shift circuit comprises a first distributed RC circuit operating as a feedback means in order to generate said first phase difference, and that said second phase shift circuit comprises a second substantially distributed RC circuit in series on the signal path in order to generate said second phase difference.

Preferred embodiments of the invention are presented in the dependent claims.

BRIEF DESCRIPTION OF THE DRAWING

Below the invention is described in more detail with the aid of the enclosed drawings, in which.

DETAILED DESCRIPTION OF THE INVENTION

Figure 2:
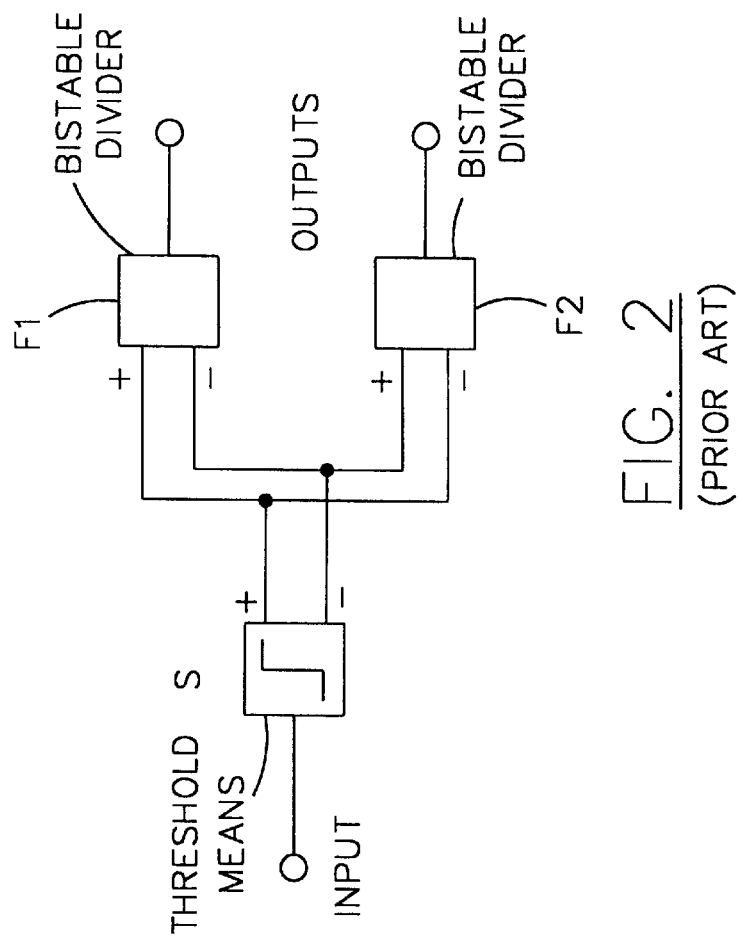
FIG. 2 shows a prior art mode of generating signals with different phases using divider circuits.
Figure 1:
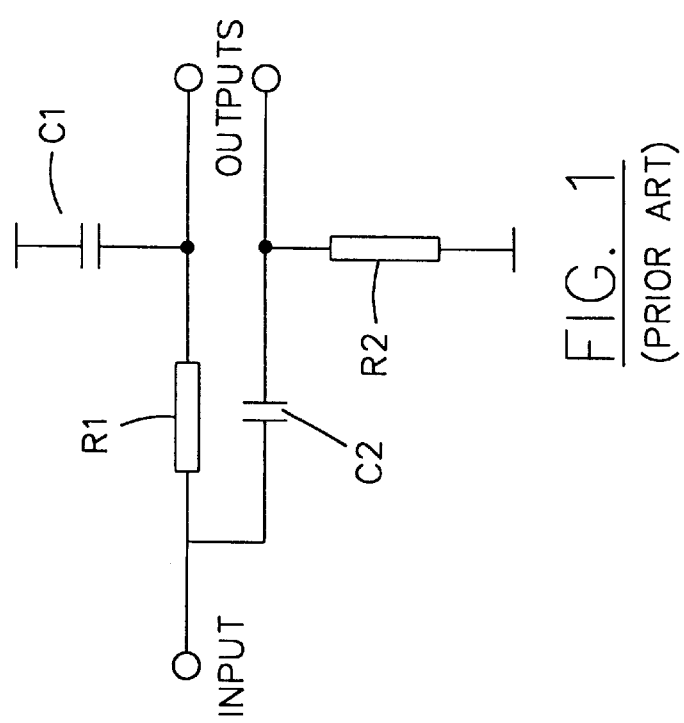
FIG. 1 shows a prior art practice for generating signals with different phases with the aid of RC circuits.
Figure 3:
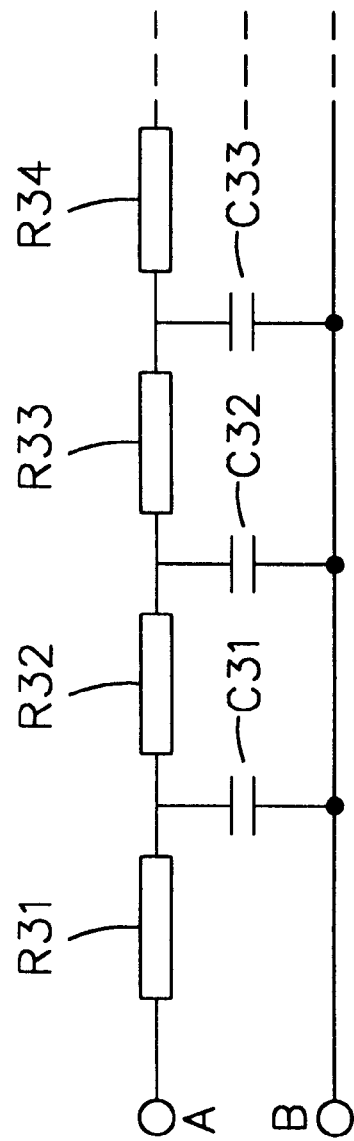
FIG. 3 shows the equivalent circuit of a distributed RC circuit.
Figure 4:
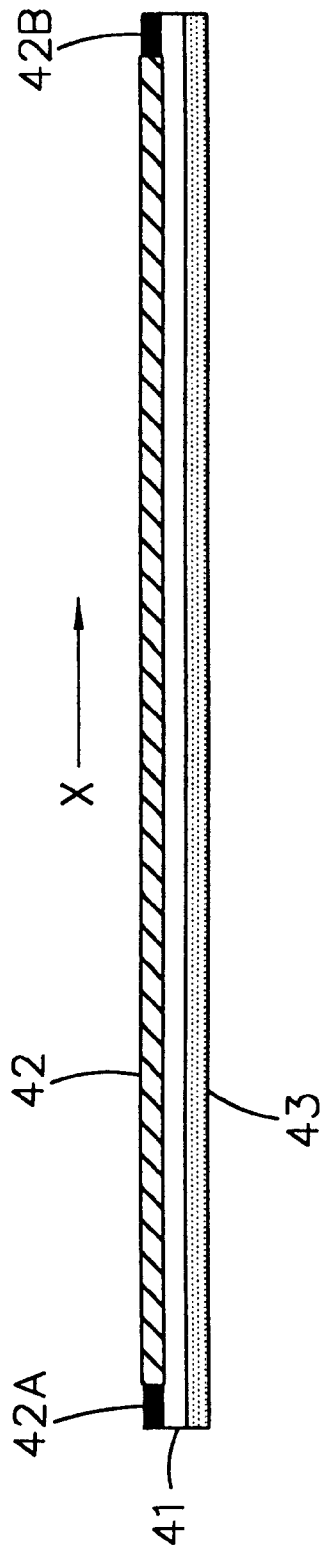
FIG. 4 shows one way to realize a distributed RC circuit.

FIGS. 1 and 2 illustrate schematically two prior art circuit solutions for generating signals with different phases, which were generally described already in the introduction. As mentioned above, the known solutions are accompanied by operating restrictions and problems in attaining sufficiently high specifications at reasonable manufacturing costs. The distributed RC circuit shown in FIGS. 3 and 4 was also described above. Below we first present the operating principle of the circuit arrangement according to the invention with the aid of FIG. 5, and then in more detail one circuit arrangement according to the invention as well as details regarding its embodiment with reference to FIG. 6.

Figure 5:
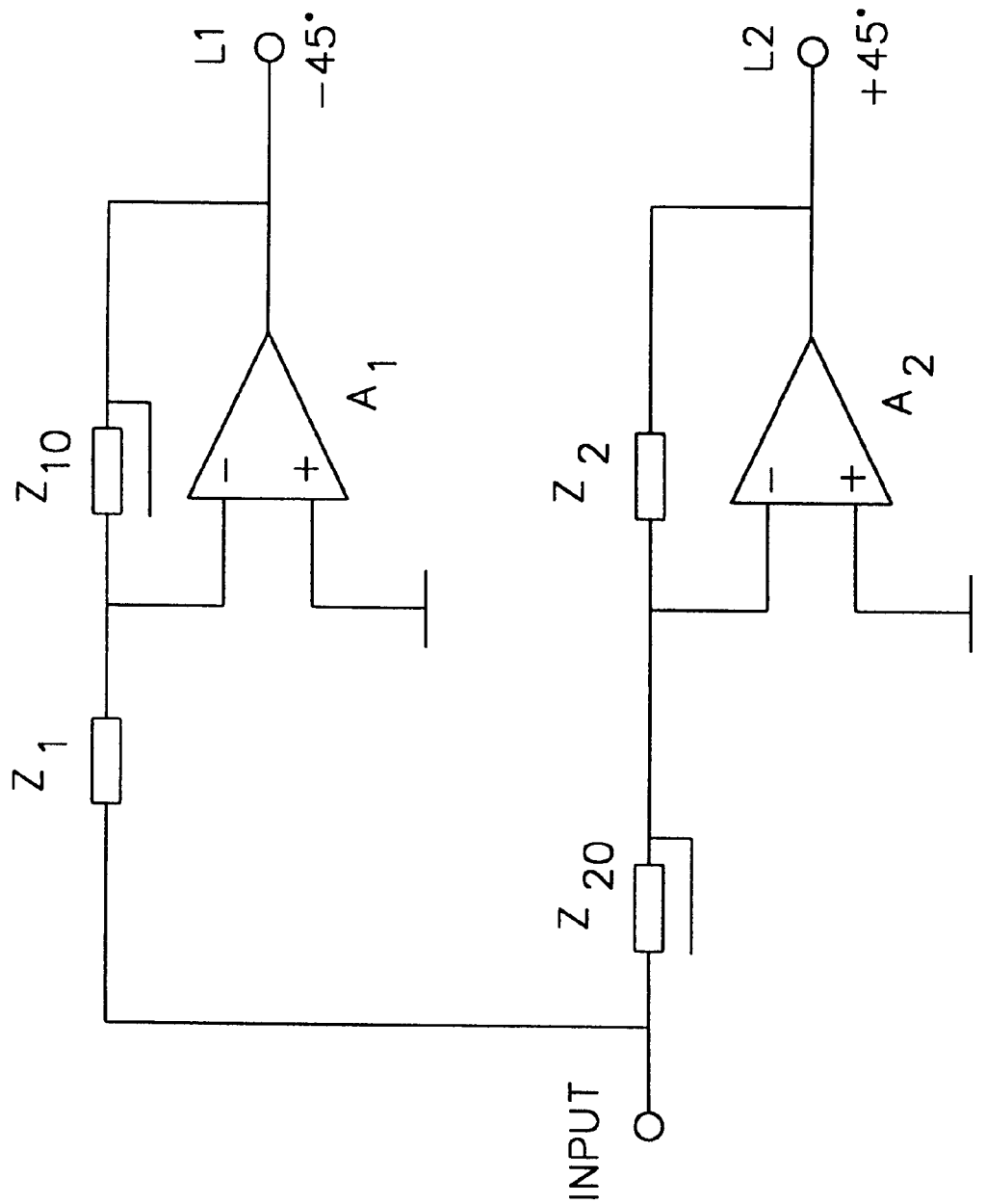
FIG. 5 shows the principle of a circuit arrangement according to the invention for generating signals with different phases.

FIG. 5 shows at a basic level one circuit solution according to the invention. It comprises two phase shift circuits, which as active means have differential amplifiers $A_1$ and $A_2$, which are connected as inverting amplifiers by connecting the positive inputs (+) to the zero potential, and by connecting the output of amplifier $A_1$ through the impedance $Z_{10}$ and the output of amplifier $A_2$ through the impedance $Z_2$ as feedbacks to the inverting inputs (−). The input signal is connected through the impedance $Z_1$ to the inverting input (−) of amplifier $A_1$ and through the impedance $Z_{20}$ to the inverting input (−) of amplifier $A_2$. The impedances $Z_1$ and $Z_2$ are substantially resistances, and the impedances $Z_{10}$ and $Z_{20}$ are distributed RC circuits.

Next we examine the transfer function G1 of the phase shift circuit comprising the components $A_1$, $Z_1$ and $Z_{10}$, and the transfer function G2 of the phase shift circuit comprising the components $A_2$, $Z_2$ and $Z_{20}$. When we assume that the amplifiers $A_1$ and $A_2$ have an infinite gain A, we obtain:

$$G_1 = -\frac{Y_1}{Y_{10}} \quad (2)$$

$$G_2 = -\frac{Y_2}{Y_{20}} \quad (3)$$

where $Y_1 = 1/Z_1$, $Y_{10} = 1/Z_{10}$, $Y_2 = 1/Z_2$ and $Y_{20} = 1/Z_{20}$. If we assume that $Y_1 = Y_2$ and $Y_{10} = Y_{20}$, the ratio of the output signals is obtained as:

$$\frac{G_1}{G_2} = \frac{Y_1 Y_2}{Y_{10} Y_{20}} = \frac{Y_1^2}{Y_{10}^2} = \left|\frac{|Y_1|}{|Y_{10}|}\right|^2 \angle -90° \quad (4)$$

When we observe the finite gain A, then:

$$\frac{G_1}{G_2} = \frac{Y_1^2}{Y_{10}^2 + \frac{(Y_{10} + Y_1)^2}{A^2} + \frac{2Y_{10}^2}{A} + \frac{2Y_{10}Y_1}{A}} \quad (5)$$

In the formula (5) we can see that when the gain A is high it gives approximately the same result as the formula (4) above. The phase difference of the signals obtained from the outputs L1 and L2 of the phase shift circuits is thus substantially 90 degrees, the phase difference of the signal obtained from output L1 being −45 degrees, and the phase difference of the signal obtained from output L2 being +45 degrees compared to the phase of the input signal.

Next we examine the order of magnitude of the component values in the circuit arrangement according to FIG. 5. For example, if the resistive component $R_{10}$ of the impedance $Z_{10}$ of the distributed RC circuit is 1 kΩ, and if the lower limiting frequency f of the RC circuit is defined as 50 MHz, then the capacitive component $C_{10}$ of the distributed RC circuit $Z_{10}$ is approximately $C_{10} = 1/(2\pi f R) = 3 \ldots 5$ pF.

Figure 6:
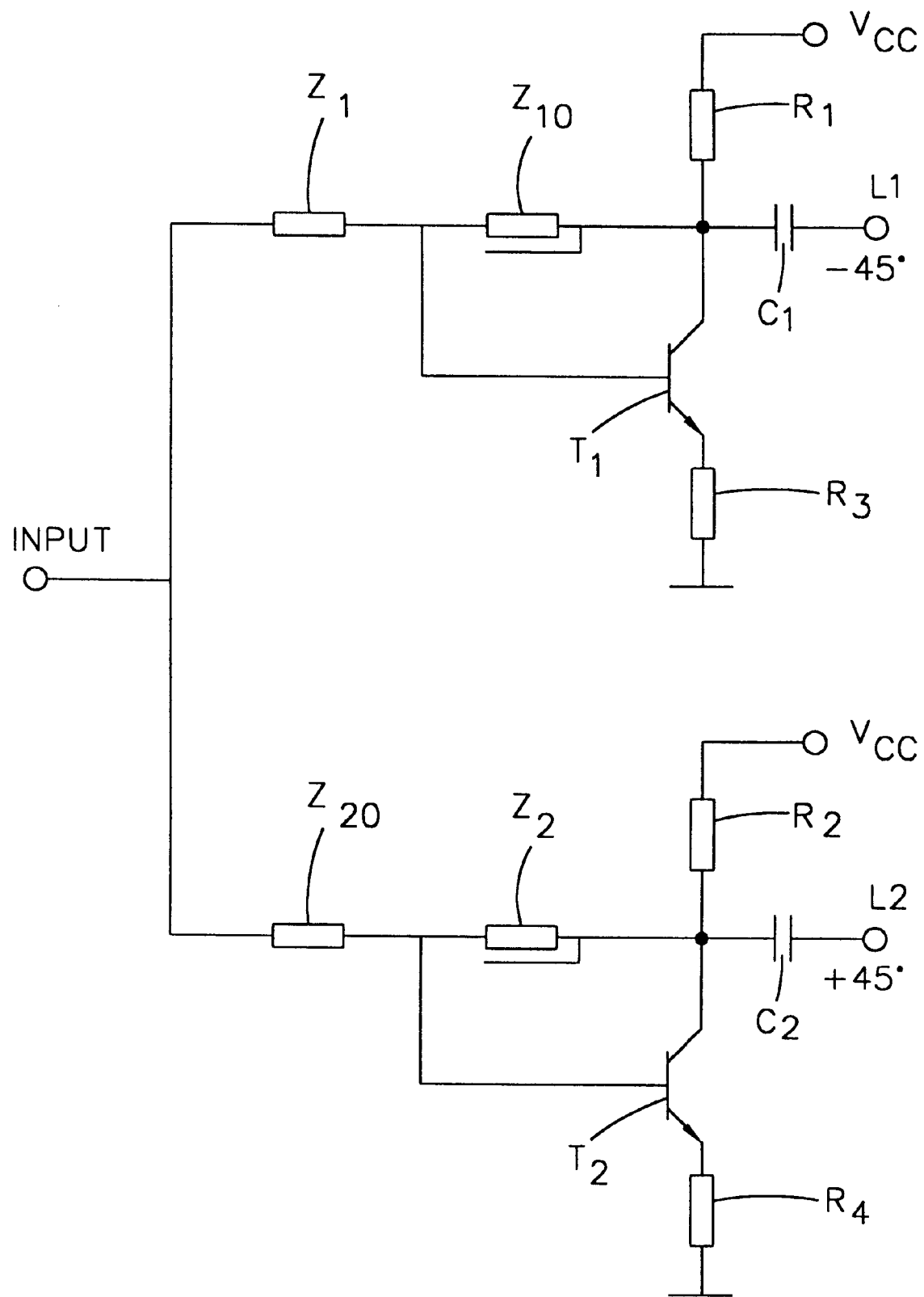
FIG. 6 shows as a circuit diagram one circuit arrangement according to the invention for generating signals with different phases.

FIG. 6 shows as a circuit diagram one circuit arrangement according to the invention, in which the bipolar transistors $T_1$ and $T_2$ act as the active means. In the first phase shift circuit the input signal is connected to the base of transistor $T_1$ through the impedance $Z_1$ in series with the signal line.

Between the collector and the base of the transistor $T_1$ the impedance $Z_{10}$, which is a distributed RC circuit, acts as the feedback means. In order to set the operating point of the transistor circuit a resistor $R_1$ is connected from the collector of transistor $T_1$ to the supply voltage $V_{cc}$, and a resistor $R_3$ from the emitter of transistor $T_1$ to the zero potential. The output signal is obtained at output L1 from the collector of transistor $T_1$ through the capacitor $C_1$, which acts as a dc voltage barrier.

In the first phase shift circuit of the circuit arrangement according to FIG. 6 the feedback impedance $Z_{10}$ is a distributed RC circuit and the impedance $Z_1$ in series in the signal line is substantially resistive. Thus the function of the circuit corresponds to the function of the first phase shift circuit in FIG. 5, and the output L1 provides a signal having a phase shift of −45 degrees compared to the input signal.

In the circuit arrangement according to FIG. 6 the second phase shift circuit corresponds to the first phase shift circuit in other respects, but the input signal is supplied to the transistor $T_2$ through a distributed RC circuit $Z_{20}$, and an substantially resistive component $Z_2$ acts as the feedback component. In order to set the operating point of the transistor $T_2$ the second phase shift circuit has resistors $R_2$ and $R_4$, and in order to separate dc voltage from the signal at the output L2 there is a capacitor C2 in the circuit. The function of the second phase shift circuit corresponds to that of the second phase shift circuit in the circuit arrangement according to FIG. 4, so that the phase difference of the signal obtained at the output L2 is substantially +45 degrees compared to that of the input signal.

In the circuit arrangement according to the invention the active means can be a bipolar transistor or a MOS transistor, for instance. The transition frequency $f_T$ of the transistor should be at least about ten times the operating frequency of the phase shift circuit. The circuit arrangement according to the invention is most advantageous when it operates in the frequency range 0.5 to 2.0 GHz, whereby the required transition frequency of the transistor is about 25 GHz.

Preferably the resistors $Z_1$ and $Z_2$ should have a low spurious capacity, so that their impedance is substantially resistive. A high quality resistor of this kind can be realized by a thin film resistor, for instance, which can be made e.g. on the semiconductor chip integrating the active parts.

The distributed resistors $Z_{10}$ and $Z_{20}$ can be e.g. a resistive film having a high capacitance. Preferably this is realized with a so called polysilicon process, which provides a Metal-Insulator-Semiconductor (MIS) capacitance.

Numerous advantages can be attained with the circuit arrangement according to the invention as compared to previously known solutions. The circuit arrangement according to the invention provides signals having a phase difference, which is very accurately 90 degrees on a wide operating frequency range, for instance so that the operating frequency spans the whole frequency range of 1 to 2 GHz. Further there are no particularly stringent requirements on the characteristics of the components in the circuit arrangement according to the invention. Neither is the circuit arrangement sensitive to variations in temperature or load. Using the circuit arrangement according to the invention requires no manually adjustable trimmer components for the adjustment of the phase difference between the signals, so that for instance the modulator of a transmitter and/or the demodulator of a receiver can be manufactured by mass-production methods saving manufacturing costs compared to prior art methods.

There is no need to process the I and Q signals as individual signals outside the integrated circuit, because the circuit according to the invention can be integrated on one silicon chip. Advantageously the phase shift circuit can be integrated in a mixer of the Gilbert cell type, for instance. The phase error due to signal transmission or the coupling of interference can be minimized when the I and Q components are generated close to those circuits where they are used, such as close to the mixers or multipliers.

With the circuit arrangement according to the invention it is also possible to obtain a very good internal signal matching when the so called Miller capacitance of the transistor is made as a distributed capacitance. This is based on the fact that in a bipolar transistor the base is then a distributed resistor and the collector a distributed capacitance, whereby it is possible to have an almost perfect matching between the transistor and the distributed RC circuit at the transistor base, if the impedances of the distributed RC circuit and the transistor are dimensioned to be equally high. Then all power at the distributed RC circuit terminal is optimally coupled to the transistor base, and not reflected back, for instance.

Because the circuit arrangement according to the invention operates on a wide frequency range it can also be used to generate the phase shifted components of the received or transmitted RF signal, instead of the local oscillator signal or in addition to it.

The detailed dimensioning of the circuit according to the invention for a transmitter or a receiver is not described in more detail, because that is considered common knowledge to a person skilled in the art and readily applicable after reading this description.

Above we presented a few applications of the circuit arrangement according to the invention. Naturally the inventive principles can be varied within the scope of the claims, regarding e.g. structural details and application areas.

What is claimed is:

1. A circuit arrangement for generating two signals from substantially the same input signal, wherein the circuit arrangement comprises:

a first phase shift circuit comprising a first amplifying means and a second phase shift circuit comprising a second amplifying means, the phase shift circuits having a common input (INPUT);

wherein a first phase difference between the output signal of the first phase shift circuit and said input signal is substantially −45 degrees, and a second phase difference between the output signal of a second phase shift circuit and said input signal is substantially +45 degrees;

said first phase shift circuit further comprises a first distributed RC circuit operating as a feedback element between an output terminal of said first amplifying means and an input terminal of said first amplifying means in order to generate said first phase difference, and a first substantially resistive means connecting between said common input and said input terminal of said first amplifying means for supplying said input signal to said first amplifying means; and said second phase shift circuit further comprises a second substantially distributed RC circuit connecting between said common input and an input terminal of said second amplifying means in order to generate said second phase difference, and a second substantially resistive means acting as a feedback element between an output terminal of said second amplifying means and said input terminal of said second amplifying means.

2. A circuit arrangement according to claim 1, wherein said first substantially resistive means of said first phase shift circuit has a value of resistance approximately equally to a value of resistance of said second substantially resistive means of said second phase shift circuit.

3. A circuit arrangement according to claim 1, characterized in that said distributed RC circuits have approximately equally high impedances.

4. A circuit arrangement according to claim 1, wherein each of said amplifying means of said first phase shift circuit and of said second phase shift circuit is a bipolar transistor having a substantially distributed Miller capacitance.

5. A circuit arrangement according to claim 4, characterized in that said Miller capacitance and the distributed RC circuit have approximately equally high capacitances.

6. A circuit arrangement according to claim 1, characterized in that said distributed RC circuit is a metal-insulator-semiconductor (MIS).

7. A circuit arrangement according to claim 1, characterized in that said first phase shift circuit and said second phase shift circuit are integrated on substantially the same substrate.

8. A demodulator of a radio receiver comprising a circuit arrangement for generating two signals from substantially same input signal, wherein the circuit arrangement comprises:

a first phase shift circuit comprising a first amplifying means and a second phase shift circuit comprising a second amplifying means, the phase shift circuits having a common input;

wherein a first phase difference between an output signal of the first phase shift circuit and said input signal is substantially −45 degrees, and a second phase difference between an output signal of the second phase shift circuit and said input signal is substantially +45 degrees;

said first phase shift circuit further comprises a first distributed RC circuit operating as a feedback element between an output terminal of said first amplifying means and an input terminal of said first amplifying means in order to generate said first phase difference, and a first substantially resistive means connecting between said common input and said input terminal of said first amplifying means for supplying said input signal to said first amplifying means; and said second phase shift circuit further comprises a second substantially distributed RC circuit connecting between said common input and an input terminal of said second amplifying means in order to generate said second phase difference, and a second substantially resistive means acting as a feedback element between an output terminal of said second amplifying means and said input terminal of said second amplifying means.

9. A modulator of a transmitter comprising a circuit arrangement for generating two signals from a substantially same input signal, wherein the circuit arrangement comprises:

a first phase shift circuit comprising a first amplifying means and a second phase shift circuit comprising a second amplifying means, the phase shift circuits having a common input;

wherein a first phase difference between an output signal of the first phase shift circuit and said input signal is substantially −45 degrees, and a second phase difference between an output signal of the second phase shift circuit and said input signal is substantially +45 degrees;

said first phase shift circuit further comprises a first distributed RC circuit operating as a feedback element between an output terminal of said first amplifying means and an input terminal of said first amplifying means in order to generate said first phase difference, and a first substantially resistive means connecting between said common input and said input terminal of said first amplifying means for supplying said input signal to said first amplifying means; and said second phase shift circuit further comprises a second substantially distributed RC circuit connecting between said common input and an input terminal of said second amplifying means in order to generate said second phase difference, and a second substantially resistive means acting as a feedback element between an output terminal of said second amplifying means and said input terminal of said second amplifying means.

* * * * *